United States Patent [19]

Katakura et al.

[11] 4,453,091
[45] Jun. 5, 1984

[54] LEVEL DETECTING CIRCUIT

[75] Inventors: Masayuki Katakura; Kenzo Akagiri, both of Yokohama; Motomi Ookouchi, Tokyo, all of Japan

[73] Assignee: Sony Corporation, Tokyo, Japan

[21] Appl. No.: 360,903

[22] Filed: Mar. 23, 1982

[30] Foreign Application Priority Data

Apr. 2, 1981 [JP] Japan ................................. 56-49590

[51] Int. Cl.³ ...................... H03K 5/153; G06G 7/24
[52] U.S. Cl. .................................. 307/350; 307/492; 307/542; 328/145; 328/162
[58] Field of Search .............. 307/350, 354, 490, 492, 307/542; 328/145, 162, 165, 127

[56] References Cited

U.S. PATENT DOCUMENTS 3,704,425 11/1972 Haigh .................................. 307/492
4,375,038 2/1983 Crosby ................................ 328/145

Primary Examiner—John Zazworsky
Attorney, Agent, or Firm—Lewis H. Eslinger; Alvin Sinderbrand

[57] ABSTRACT

A level detecting circuit for use in a noise reduction circuit and which produces a level detected output signal in response to an input signal, includes an operational amplifier with at least one feedback diode for logarithmically converting the input signal to produce a logarithmically converted signal; a first PN junction element comprised of a first diode supplied with the logarithmically converted signal; a second PN junction element comprised of a second diode connected in series with the first diode at a connection point, the series-circuit of the first and second diodes having a first saturation current; a first integrating capacitor having a first capacitance and connected to the connection point for producing an integrated signal; a third PN junction element comprised of series-connected third and fourth diodes connected in parallel with the series connection of the first and second diodes and having a second saturation current greater than the first saturation current; a second integrating capacitor having a second capacitance less than the first capacitance and connected to the second and fourth diodes; a reference current source for providing a reference current to the series-connected first and second diodes and series-connected third and fourth diodes, and an output circuit for producing the level detected output signal in response to the integrated signal, such that, upon an abrupt attenuation of the input signal, the level of the level detected output signal is maintained for a predetermined time to substantially eliminate low frequency band harmonic distortion.

17 Claims, 11 Drawing Figures

LEVEL DETECTING CIRCUIT

BACKGROUND OF THE INVENTION

This invention relates generally to level detecting circuits and, more particularly, is directed to a level detecting circuit of the logarithmic compression type.

Noise reduction circuits for reducing noise and distortion which accompany a reproduced information signal are well-known in the art. Such noise reduction circuits are designed to increase the dynamic range of the signal that can be recorded and reproduced from a recording medium such as a magnetic tape. Such noise reduction circuits generally incorporate an encoding process which compresses the level of the information signal prior to recording the signal on the recording medium, and a decoding process which expands the level of the information signal, during the reproducing operation, with a characteristic which is complementary to the compression characteristic. As a result, various restrictions imposed on the dynamic range of the information signal by the signal transmission paths and the recording medium can be eliminated.

One such noise reduction circuit uses a transmission circuit having a variable compression/expansion characteristic which is dependent on the level and/or frequency of the input information signal. Such transmission circuit has a gain controlled amplifier, such as a voltage controlled amplifier, which effects the aforementioned compression and expansion operations, and a level detecting circuit which supplies a control voltage corresponding to the input information signal to the voltage controlled amplifier for controlling the variable compression/expansion characteristic.

In such systems, when the level of the input information signal is abruptly increased, the resulting reproduced output signal has a corresponding overshoot portion which is substantially greater than the desired level of the output signal. The time within which this overshoot portion falls back to its desired level is termed the attack time or rise time constant. However, it becomes difficult to choose a correct attack time since an attack time which is too long will distort the sound which is eventually reproduced and an attack time that is too short will result in a clicking noise in the reproduced sound. In like manner, when the input signal level falls from a high value to a low value, a negative overshoot occurs and the time within which the level of the signal returns from the overshoot level to its desired level is termed the recovery time or fall time constant. Accordingly, a sophisticated "forward masking effect" is used to optimally determine the respective time constants. An optimum attack time is therefore set in the range of approximately 100 $\mu$sec. to 10 msec. The recovery time is optimally set for a comparitively long time, for example, in the range from several ten msec. to several hundred msec., that is, at least one hundred times the attack time.

When an input information signal is supplied to the noise reduction circuit, noise which is generated in the magnetic tape and which is noticeable is superimposed upon the output of the system. Since the level of the generated noise is generally much less than that of the input information signal, the noise is masked by the input signal. However, in the case where a signal, such as a tone burst signal, is constantly supplied to the noise reduction circuit, and is then suddenly dropped at a predetermined instant of time, the input information signal supplied to the circuit is sharply attenuated or blocked. On the other hand, the generated noise is not attenuated instantaneously, but rather, is attenuated with a definite time constant determined by the fall time constant of the level detecting circuit. Accordingly, this portion of the noise is not directly masked by the input information signal. Generally, however, when a high level signal is blocked or sharply attenuated at such predetermined instant of time, the human ear will not regain its sensing capacity with respect to a low level signal, such as the aforementioned noise signal, until a predetermined lapse of time. In such case, if the attenuation of noise accompanying the sharp attenuation or blocking of the input information signal is effected during the forward masking period, that is, typically from 100 msec. to 200 msec., the accompanying noise is not sensed by the human ear. This phenomenon is generally referred as a "noise modulation" phenomenon. Accordingly, it is therefore desirable to set the fall time constant of the level detecting circuit to about 100 msec.

On the other hand, if the fall time constant is set at approximately 100 msec., ripple components contained in the detected output increase, resulting in an increase in harmonic distortion. In particular, the detected output of the noise reduction circuit contains ripple components which are comprised mainly of the fundamental wave of the input information signal where half-wave rectification is performed and the second harmonic wave of the input information signal in the case where full-wave rectification is performed. In such case, the level of the ripple components is substantially inversely proportional to the fall time constant and frequency. With the above-described noise reduction circuit, the gain control amplifier which is controlled by the level detecting circuit functions as a multiplier such that a second harmonic wave is generated in response to the fundamental component of the ripple and a third harmonic wave is generated in response to the second harmonic component of the ripple, thereby resulting in harmonic distortion.

Although harmonic distortion does not pose as a problem in a simplified noise reduction circuit which effects the aforementioned compression and expansion operations over only a high frequency region, significant problems are presented with a high performance noise reduction circuit, which in addition, effects a noise reduction operation over a low frequency region. In the latter case, it is therefore necessary to extend the aforementioned fall time constant which, in turn, renders it impossible to set an optimum fall time constant for the aforementioned noise modulation phenomenon.

To overcome this problem, it has been proposed to utilize a gain control circuit which is controlled by a rectangular signal detecting circuit, as described more fully in U.S. patent application Ser. No. 06/246,392, filed Mar. 23, 1981, having a common assignee herewith, and the disclosure of which is incorporated into this application. However, in this latter circuit, the dynamic range of the rectangular signal detecting circuit is determined by the supply voltage and the off-set voltage of the circuit, and thereby has a theoretical upper limit for the dynamic range of about 60 dB. Accordingly, where it is required that the dynamic range used with a noise reduction circuit exceeds 40 to 50 dB, it is more practical to use an exponential-to-logarithmic conversion circuit or a logarithmic compression circuit having a dynamic range greater than 60 dB for the level detecting circuit which produces the control voltage for the gain control amplifier. A level detecting circuit of the logarithmic compression type is described in U.S. patent application Ser. No. 06/325,207, filed Nov. 27, 1981, having the same inventorship and a common assignee herewith, and the disclosure of which is incorporated herein by reference. However, even in the aforementioned level detecting circuit of the logarithmic compression type, no means are provided for controlling the fall time constant to account for both low frequency harmonic band distortion and the aforementioned noise modulation phenomenon.

OBJECTS AND SUMMARY OF THE INVENTION

Accordingly, it is an object of this invention to provide a level detecting circuit of the logarithmic compression type that avoids the above-described difficulties encountered in the prior art.

More particularly, it is an object of this invention to provide a level detecting circuit of the logarithmic compression type which provides a hold effect for the fall time constant.

It is another object of this invention to provide a level detecting circuit of the logarithmic compression type which can be used with a high performance noise reduction system, has a very broad dynamic range, is capable of setting an optimum fall time to eliminate or substantially reduce low frequency harmonic band distortion and has a high noise reduction effect.

It is still another object of this invention to provide a level detecting circuit of the logarithmic compression type which is adapted to eliminate or substantially reduce low frequency harmonic band distortion resulting from an increase in the ripple component of the detected output signal when the fall time constant is set to a reduced value.

In accordance with an aspect of this invention, a level detecting circuit for producing a level detected output signal in response to an input signal, includes means for logarithmically converting the input signal to produce a logarithmically converted signal; first means forming a first signal path supplied with the logarithmically converted signal and having a first saturation current; second means forming a second signal path supplied with the logarithmically converted signal and having a second saturation current greater than the first saturation current; reference current means for supplying a reference current to the first and second signal paths; first capacitance means having a first capacitance and connected to the first signal path for producing an integrated signal; second capacitance means having a second capacitance less than the first capacitance and connected to the first and second signal paths; and output means for producing the level detected output signal in response to the integrated signal.

The above, and other, objects, features and advantages of the present invention will become readily apparent from the ensuing detailed description of the illustrative embodiments of the invention which is to be read in connection with the accompanying drawings.

DETAILED DESCRIPTION OF THE PREFERRED EMBODIMENTS

Figure 1:
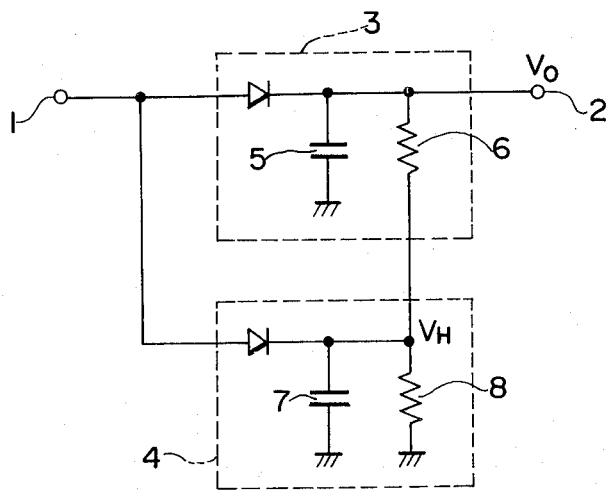
FIG. 1 is a circuit wiring diagram of a level detecting circuit according to the prior art.

Referring to the drawings in detail, and initially to FIG. 1 thereof, a linear level detecting circuit of the type described in copending U.S. patent application Ser. No. 06/246,392, filed on Mar. 23, 1981, and having a common assignee herewith, is supplied with an alternating current input signal at an input terminal 1 thereof. The alternating current input signal is supplied from input terminal 1 to a first detecting circuit 3 and a second detecting circuit 4. In particular, the alternating current input signal from input terminal 1 is supplied through a diode of first detecting circuit 3 to an output terminal 2 of the level detecting circuit. An integrating capacitor 5 is connected between output terminal 2 and ground, and a resistor 6 is connected between output terminal 2 and a resistor 8 of second detecting circuit 4, the opposite end of resistor 8 being connected to ground. In like manner, the alternating current input signal from input terminal 1 is supplied through a diode of second detecting circuit 4 to the connection point between resistors 6 and 8, and an integrating capacitor 7 is connected between such connection point and ground. With this arrangement, the fall time constant is determined by capacitor 5 and resistor 6, the latter of which functions as a first discharge resistor. A hold time constant is determined by second detecting circuit 4 and, in particular, by capacitor 7 and resistor 8 thereof, the latter resistor functioning as a second discharge resistor. Typically, the hold time constant of second detecting circuit 4 is set in the range from 10 to 20% of the fall time constant of first detecting circuit 3.

In operation, when a constant level input signal is supplied to input terminal 1, a steady-state condition is achieved such that the output voltage $V_0$ at output terminal 2 is substantially equal to the hold voltage $V_H$ at the connection point between first and second discharge resistors 6 and 8. In such case, the constant current through first discharge resistor 6 is substantially equal to zero. However, when the signal to input terminal 1 is blocked in accordance with the aforementioned discussion, the current to resistor 6 would normally change rapidly if second detecting circuit 4 were not provided. Accordingly, second detecting circuit 4 provides a hold effect in which, when the input signal is blocked, the current through first discharge resistor 6 is substantially maintained at its zero level until the lapse of a predetermined period from the time immediately after the input current signal is blocked. In this state, that is, during this hold period, the voltage by first integrating capacitor 5 is maintained without being discharged, whereby output voltage $V_0$ does not change. When the hold period which is determined by the hold time constant of second detecting circuit 4 has elapsed, the voltage across second integrating capacitor 7 begins to discharge to reduce the value of the hold voltage $V_H$ which, in turn, results in current flowing through first discharge resistor 6 so as to discharge first integrating capacitor 5. In this manner, discharge of first integrating capacitor 5 can be prevented during the predetermined hold period so as to substantially eliminate ripple components which occur within the hold period and thereby suppress low frequency band harmonic distortion, even in the case where a short fall time constant is set.

It is to be noted, however, that the theoretical limits of the dynamic range of this circuit are determined by the supply source voltage and the off-set voltage of the circuit. Thus, with such circuit, a typical value of the upper limit of the dynamic range that can be obtained with the circuit of FIG. 1 is approximately 60 dB. However, where the desired dynamic range of the level detecting circuit exceeds 60 dB, it is preferable to utilize a level detecting circuit of the exponential-to-logarithmic conversion type or of the logarithmic compression type. Practically speaking, when a dynamic range greater than 40 to 50 dB is required, level detecting circuits of the exponential-to-logarithmic conversion type or of the logarithmic compression type are used.

Figure 2:
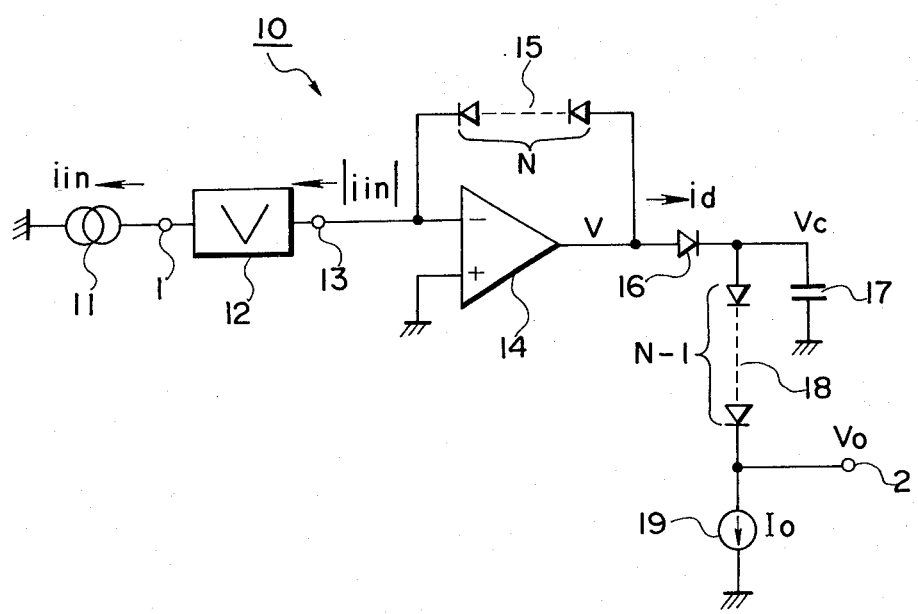
FIG. 2 is circuit wiring diagram of a level detecting circuit of the logarithmic compression type according to the prior art.
Figure 3:
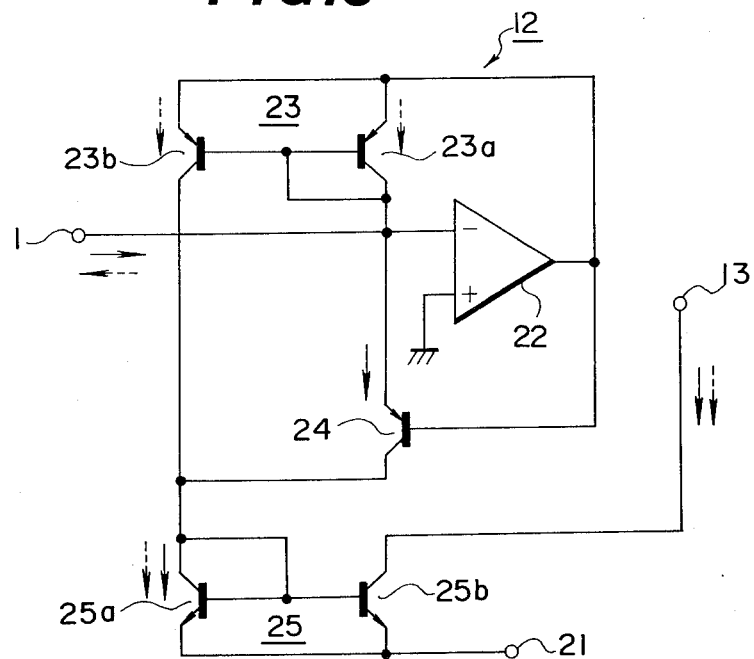
FIG. 3 is a circuit wiring diagram of an absolute value circuit that can be used in the level detecting circuit of FIG. 2.

Referring now to FIG. 2, a known level detecting circuit 10 of the logarithmic compression type is supplied at an input terminal 1 thereof with an input current $i_{in}$ from an input current source 11. The input current is supplied from input terminal 1 to an absolute value circuit 12 which functions as a high precision full-wave rectifier and which, in turn, supplies a full-wave rectified signal to a terminal 13. One embodiment of an absolute value circuit 12 that can be utilized in level detecting circuit 10 is shown in FIG. 3 to include an operational amplifier 22 having its inverting input connected to input terminal 1 and its non-inverting input grounded. The output of operational amplifier 22 is connected to the base of a PNP transistor 24 and to the emitters of two PNP transistors 23a and 23b, with the latter two transistors forming a current mirror circuit 23. In particular, the bases of transistors 23a and 23b are commonly connected to the collector of transistor 23a, to input terminal 1 and to the emitter of transistor 24. The collectors of transistors 23b and 24 are commonly connected to the collector of an NPN transistor 25a which, along with another NPN transistor 25b, form a second current mirror circuit 25. In the same manner as current mirror circuit 23, the bases of transistors 25a and 25b are commonly connected to the collector of transistor 25a, and the emitters of transistors 25a and 25b are commonly connected to a negative voltage supply terminal 21. The output of absolute value circuit 12 is produced at the collector of transistor 25b and is supplied to terminal 13.

In operation, current in the positive or forward direction, that is, as indicated by the solid arrow, is supplied through input terminal 1 to the inverting input of operational amplifier 22 which functions to invert or reverse the current. Accordingly, transistor 24 is turned ON so that current in the forward direction from input terminal 1 is supplied through the emitter-collector path of transistor 24, as indicated by the solid arrow adjacent transistor 24. At this time, transistors 23a and 23b are turned OFF. The forward current flowing through the emitter-collector path of transistor 24 thereby flows through the emitter-collector path of transistor 25a of current mirror circuit 25, thereby causing current in the direction of the solid arrow to be produced at output terminal 13. On the other hand, current flowing in the negative or backward direction to input terminal 1, as indicated by the broken arrow thereat, is inverted by operational amplifier 22 which, in turn, produces a positive flowing current. Accordingly, at this time, transistor 24 is turned OFF. However, at this time, current flows through the emitter-collector path of transistor 23a of current mirror circuit 23, as indicated by the broken arrow, thereby causing current to flow through the emitter-collector path of transistor 23b in the forward direction as indicated by the broken arrow thereat. This latter current then flows through the emitter-collector path of transistor 25a. It is to be appreciated that the direction of current flow through transistor 25a is therefore the same, regardless of the direction of current flow at input terminal 1. Thus, regardless of the direction of current flow at input terminal 1, current flows in the same direction at terminal 13, as indicated by the solid and broken arrows thereat.

The output current signal at terminal 13 is supplied to the inverting input of an operational amplifier 14 which has its non-inverting input grounded. The output of amplifier 14 is connected to the input thereof through a plurality of N series connected diodes 15, whereby amplifier 14 and diodes 15 function to logarithmically amplify the input signal supplied thereto from terminal 13. The output from operational amplifier 14 is also connected through a diode 16 and a capacitor 17 to ground, and the connection or junction point between diode 16 and capacitor 17 is connected to a reference current source 19 through a plurality of $(N-1)$ series connected diodes 18. The connection point between the $(N-1)$ diodes 18 and current source 19 is connected to an output terminal 2 at which the level detected output signal is produced.

If the input current produced by input current source 11, regardless of the direction thereof, is designated by $i_{in}$, the output current from absolute value circuit 12 is designated by $|i_{in}|$, which represents the absolute value of the current from current source 11, and the saturation current of each of diodes 15, 16 and 18 is designated by $I_S$, the output voltage v from operational amplifier 14 can be obtained. In particular, the general expression for the voltage-current relation of a diode is expressed as follows:

$$i = I_S[\exp(-V/V_T) - 1] \tag{1}$$

If equation (1) is rearranged to solve for the voltage V across each diode 15, the output voltage v at the output of operational amplifier 14, taking into consideration the N diodes 15, is expressed as follows:

$$v = N \cdot V_T \ln\left(\frac{|i_{in}|}{I_S} + 1\right), \tag{2}$$

where the current flowing through diodes 15 is equal to the absolute value of the current from input current source 11, N represents the number of diodes 15, $V_T$ is Boltzmann's constant which is equal to $kT/q$, T is the absolute temperature and q is the element charge. In the transient state of operation, and considering the instantaneous value of the voltage $V_C$ across capacitor 17 to be fixed, the current $i_d$ through diode 16 can be expressed as follows:

$$i_d = I_S \left[ \exp\left(\frac{v - V_C}{V_T}\right) - 1 \right] . \tag{3}$$

If the voltage v from amplifier 14, as represented by equation (1), is substituted into equation (3), the current $i_d$ through diode 16 can be expressed as follows:

$$i_d = I_S \left[ \left(\frac{i_{in}}{I_S} + 1\right)^N \cdot \exp\left(-\frac{V_C}{V_T}\right) - 1 \right] . \tag{4}$$

On the other hand, during steady-state conditions, the steady-state current $\bar{i}_d$ is expressed as follows:

$$\bar{i}_d = \frac{1}{T} \int_O^T i_d dt. \tag{5}$$

If diode current $i_d$ from equation (4) is substituted into equation (5), the following equation is obtained:

$$\bar{i}_d = I_S \left[ \frac{1}{T} \exp\left(-\frac{V_C}{V_T}\right) \int_O^T \left(\frac{i_{in}}{I_S} + 1\right)^N dt - 1 \right] . \tag{6}$$

It is to be appreciated, however, that during steady-state conditions, $$\bar{i}_d = I_O \tag{7}$$

If equations (6) and (7) are combined to eliminate the $i_d$ term, and then solved for the voltage $V_C$ across capacitor 17, the following steady-state equation for capacitor voltage $V_C$ can be obtained.

$$V_C = V_T \left[ \ln\left\{ \frac{1}{T} \int_O^T \left(\frac{|i_{in}|}{I_S} + 1\right)^N dt \right\} - \ln\left(\frac{I_O}{I_S} + 1\right) \right] . \tag{8}$$

It should be readily apparent from FIG. 2 that the steady-state output voltage $V_O$ at output terminal 2 is equal to the steady-state capacitor voltage $V_C$ less the voltage drop across the $(N-1)$ diodes 18. In other words, the steady-state output voltage $V_O$ can be expressed as follows:

$$V_O = V_C - V_T(N-1) \ln\left(\frac{I_O}{I_S} + 1\right) . \tag{9}$$

If the steady-state capacitor voltage $V_C$ from equation (8) is substituted into equation (9), the equation for the steady-state output voltage $V_O$ can be rewritten as follows:

$$V_O = \tag{10}$$

$$V_T \left[ \ln\left\{ \frac{1}{T} \int_O^T \left(\frac{|i_{in}|}{I_S} + 1\right)^N dt - N \cdot \ln\left(\frac{I_O}{I_S} + 1\right) \right\} \right] .$$

However, during steady-state conditions, $|i_{in}|$ and $I_O \gg I_S$, so that the steady-state output voltage $V_O$ can be approximated as follows:

$$V_O \simeq V_T \left[ \ln\left\{ \frac{1}{T} \int_O^T \left(\frac{|i_{in}|}{I_S}\right)^N dt \right\} - \ln\left(\frac{I_O}{I_S}\right)^N \right] . \tag{11}$$

To simplify equation (11), the following equality is defined:

$$\overline{|i_{in}|^N} \equiv \frac{1}{T} \int_O^T |i_{in}|^N dt. \tag{12}$$

If equation (12) is substituted into equation (11), the approximate steady-state value for the output voltage $V_O$ can be expressed as follows:

$$V_O \simeq V_T \ln\left(\frac{\overline{|i_{in}|}}{I_O}\right) N. \tag{13}$$

It should be appreciated from equation (13) that the output voltage $V_O$ of level detecting circuit 10, which is of the logarithmic compression type, is obtained as a function of the Nth order of the absolute value of the input current $i_{in}$. Thus, level detecting circuit 10 of FIG. 2 is adapted to perform a level detecting operation for dynamic ranges of 80 dB or more. However, level detecting circuit 10 does not provide a hold effect to eliminate ripple components that result in low frequency band harmonic distortion.

Figure 4:
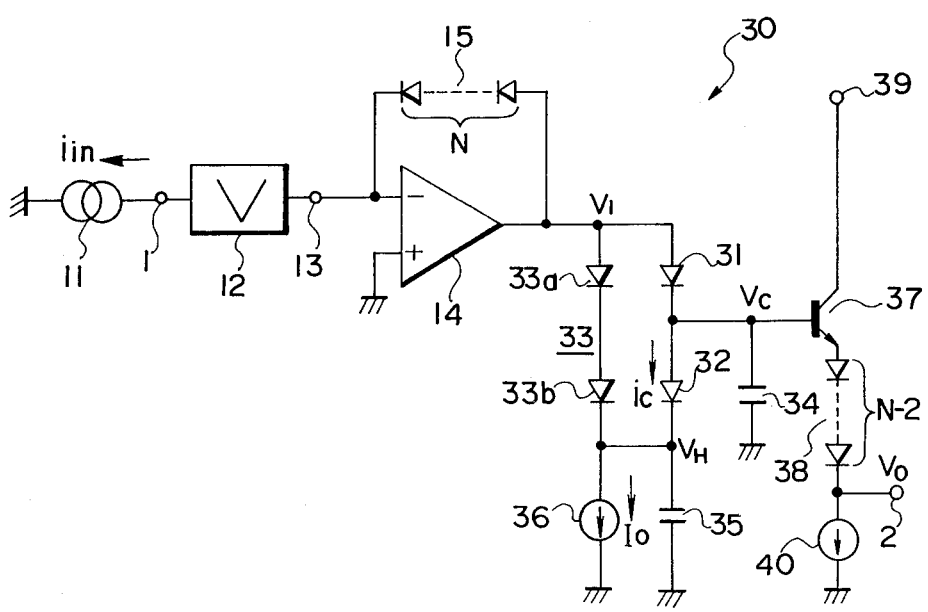
FIG. 4 is a circuit wiring diagram of a level detecting circuit according to one embodiment of this invention.

Referring now to FIG. 4, a level detecting circuit 30 according to one embodiment of this invention will now be described, with elements corresponding to those described above with reference to the circuit of FIG. 2 being identified by the same reference numerals and a detailed description thereof being omitted herein for the sake of brevity. In particular, level detecting circuit 30 of FIG. 4 is a modification of circuit 10 of FIG. 2 and includes a first signal path formed of a diode 31 which functions as a first PN junction element and a diode 32 which functions as a second PN junction element connected in series in their forward biasing directions between the output of an operational amplifier 14 and a current source 36. A second signal path formed of a third PN junction element 33 which comprises two series-connected diodes 33a and 33b is connected in parallel with the series connection of diodes 31 and 32. It is to be appreciated that the number of PN junctions provided by the first and second PN junction elements, that is, diodes 31 and 32, is equal to the number of PN junctions provided by the third PN junction element 33, that is, diodes 33a and 33b. Further, although diodes have been used for the PN junction elements, any other suitable semi-conductive device may be used, for example, each diode may be replaced with a transistor having its collector connected to its base. A first electrostatic capacitance element comprised of a integrating capacitor 34 is connected between the connection point of the series-connected diodes 31 and 32 and ground, and a second electrostatic capacitance element comprised of an integrating capacitor 35 is connected between the connection point of diodes 32 and 33b and ground. The voltage across capacitor 34 is converted in a level shift section constituted by an NPN transistor 37 connected as an emitter-follower and a plurality of (N−2) diodes 38, to produce an output voltage $V_O$ at output terminal 2. A positive voltage supply terminal 39 is connected to the collector of transistor 37 and a second reference current source 40 supplies a bias current to the (N−2) diodes 38 and transistor 37.

In order to provide a desired hold effect with respect to the fall time constant, as previously described in regard to the circuit of FIG. 1, the saturation current through third PN junction element 33 is set at approximately ten times the saturation current through diodes 31 and 32. In this manner, from a steady-state current standpoint, the current from first reference current source 36 is divided in correspondence with the ratio between the saturation current through diodes 31 and 32 and the saturation current through diodes 33a and 33b. In addition, the capacitance of capacitor 35 is set to a fraction of the capacitance of capacitor 34, although the former capacitance may be varied depending upon the hold period desired.

Figure 5:
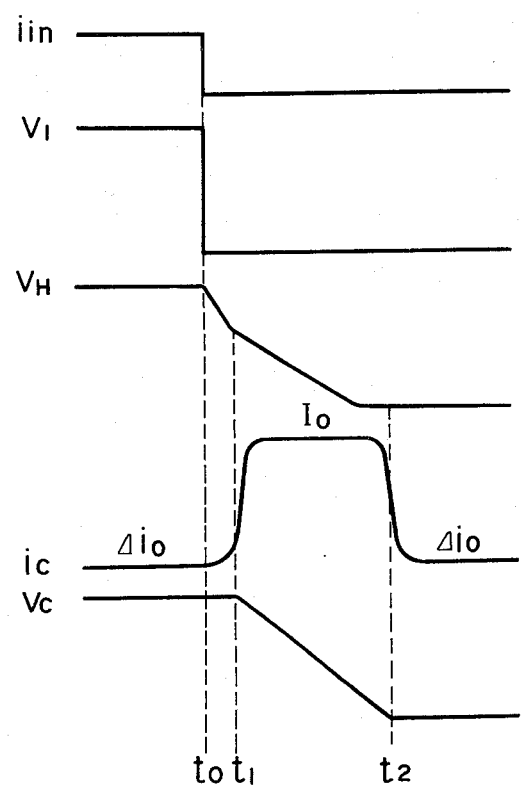
FIG. 5 is a timing chart of various signals for illustrating the operation of the circuit of FIG. 4.

In operation, the current $i_c$ flowing through diode 32 is equal to $\Delta i_0$ which, in turn, is equal to the divided portion of current $I_O$ from current source 36 prior to a time $t_0$ corresponding to the falling or blocking of input current $i_{in}$ from input signal source 11. It is to be appreciated that the current $\Delta i_0$ is of the order of 1/10 of $I_0$ in accordance with the aforementioned saturation current ratio. When input signal $i_{in}$ falls from its high value to a low value at time $t_0$, the terminal voltages $V_C$ and $V_H$ across the respective capacitors 34 and 35 do not change instantaneously. Accordingly, the current $i_c$ through diode 32 is equal to the aforementioned current $\Delta i_0$ at such time. At this time, capacitor 34 is caused to discharge by current $\Delta i_0$, and capacitor 35 is discharged by the current $(I_0 - i_0 I_0)$. I0). It is to be appreciated that the rate of change of the terminal voltage $V_C$ across capacitor 34 is extremely small as a result of the capacitance of capacitor 34 being greater than that of capacitor 35 and because the aforementioned discharge current $\Delta i_0$ is low. Capacitor 35, on the other hand, is discharged in a short period of time from its terminal voltage $V_H$ because of the low capacitance thereof and the relatively high discharge current of approximately $I_0$, as shown in FIG. 5. Thus, when the terminal voltage $V_H$ is reduced to a predetermined value, the potential difference across diode 32 increases, for example, at a time $t_1$, resulting in the current $i_C$ through diode 32 increasing from its initial value $\Delta i_0$, as shown in FIG. 5. It is to be appreciated that eventually, the current across diode 32 becomes equal to the current $I_0$ from current source 36, as shown in FIG. 5, and is used as the discharge current for discharging capacitor 34. At a time $t_2$, when the discharge operation with respect to capacitors 34 and 35 has been substantially completed, the current $I_0$ is again divided between the series connection of diodes 33a and 33b and the series connection of diodes 31 and 32, whereby the current across diode 32 returns to its its initial current value $i_c$. It is to be appreciated from the above description of the operation of level detecting circuit 30 of FIG. 4 that discharge of capicator 34 from its terminal voltage $V_C$ between times $t_0$ and $t_1$ is caused only by current $\Delta i_0$, as shown in FIG. 5. In other words, the level of the terminal voltage $V_C$ is maintained at its initial value between times $t_0$ and $t_1$ to obtain a so-called hold effect to overcome the problems previously discussed in regard to ripple components. For the period between times $t_1$ and $t_2$, the operation is similar to the circuit of FIG. 2, and the small fall time constant can be set to an optimum value to overcome the aforementioned noise modulation phenomenon. Accordingly, it should be appreciated that the present invention provides a level detecting circuit of the logarithmic compression type which overcomes the disadvantages of low frequency band harmonic distortion while, at the same time, being capable of setting an optimum fall time constant to avoid the noise modulation phenomenon.

Figure 6:
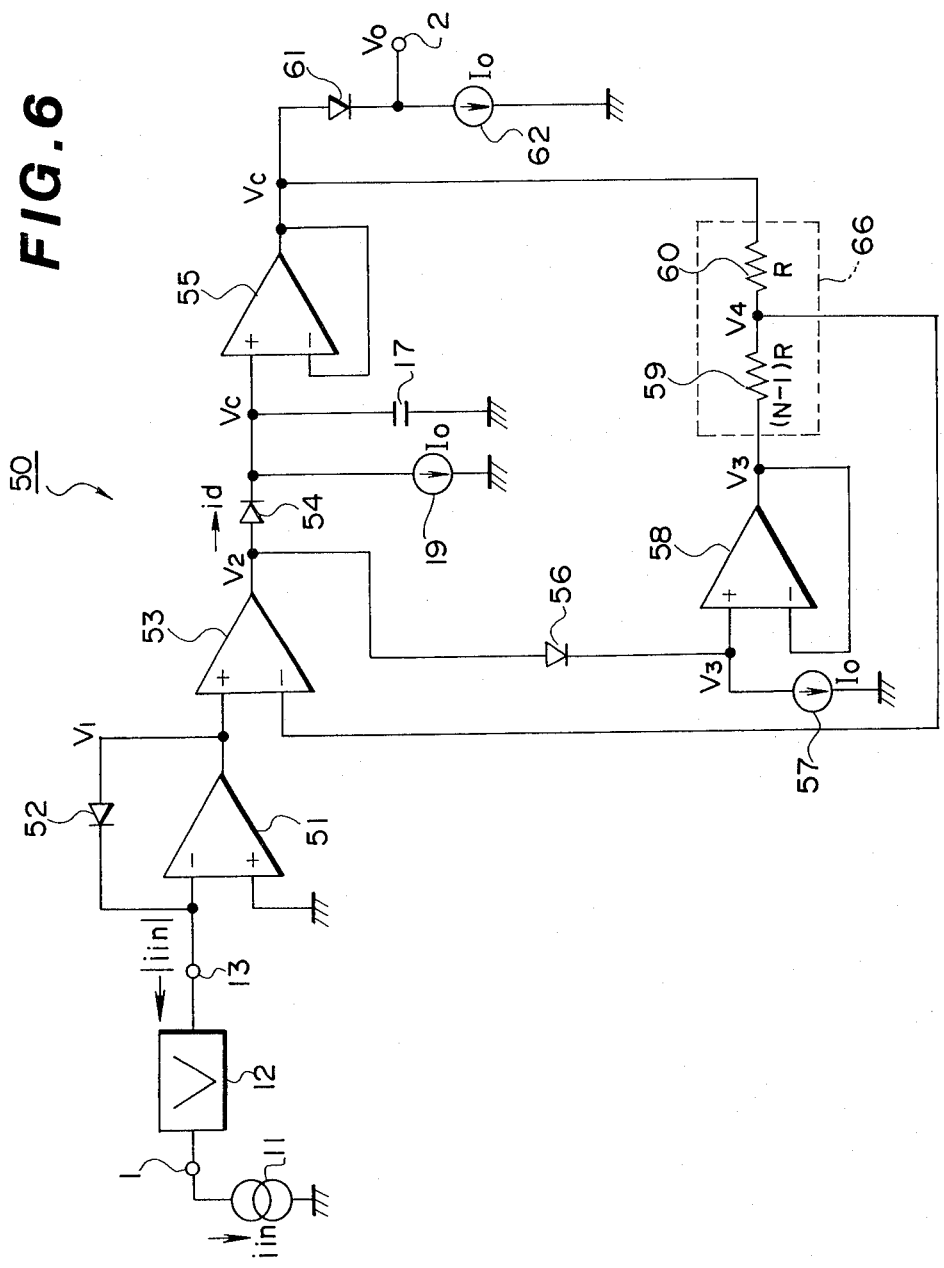
FIG. 6 is a circuit wiring diagram of a previously proposed level detecting circuit of the logarithmic compression type.

Referring now to FIG. 6, there is shown a level detecting circuit of the logarithmic compression type, as previously proposed by the same applicants of this invention, and described in U.S. patent application Ser. No. 06/325,207, filed Nov. 27, 1981, having a common assignee herewith, and the disclosure of which is incorporated herein by reference. In particular, level detecting circuit 50 of FIG. 6 is designed to produce optimum rise and fall time constants in response to both the level and frequency of the input signal supplied thereto. Accordingly, referring to FIG. 6, level detecting circuit 50 will now be described, in which elements corresponding to those described above with reference to the prior art circuit of FIG. 2 are identified by the same reference numerals and a detailed description thereof will be omitted for the sake of brevity.

In particular, a current source 11 supplies an input current $i_{in}$ through an input terminal 1 to an absolute value circuit 12 which, in turn, supplies a signal $|i_{in}|$ corresponding to the absolute value of input current $i_{in}$ through a terminal 13 to the inverting input of an operational amplifier 51. The absolute value circuit of FIG. 3 may be used for absolute value circuit 12. The non-inverting input of operational amplifier 51 is grounded and the output of amplifier 51 is connected to the inverting input thereof through a single logarithmic converting diode 52. It is to be appreciated that this circuit only requires the use of a single logarithmic converting diode, unlike the N plurality of diodes 15 in level detecting circuit 10 of FIG. 2. Output voltage $v_1$ of operational amplifier 51 is supplied to the non-inverting input of an operational amplifier 53 which functions as a differential error circuit that amplifies the difference between the voltage $v_1$ supplied to its non-inverting input and another voltage supplied to its inverting input.

The output voltage $v_2$ from amplifier 53 is supplied through a diode 54 to an integrating capacitor 17, the latter being connected between ground and diode 54. Further, a current source which supplies a reference current $I_0$ is connected between ground and the junction between diode 54 and capacitor 17. The capacitor voltage $V_C$ from capacitor 17 is then supplied to the non-inverting input of an operational amplifier 55 which functions as a voltage follower circuit and has its output connected to its inverting input. Accordingly, capacitor voltage $V_C$ is produced at the output of amplifier 55. The output of amplifier 55 is connected through a diode 61 to a current source 62, which provides a reference current $I_0$, and the connection point between diode 61 and reference current source 62 is connected to an output terminal 2 at which the output voltage $V_0$ of circuit 50 is produced.

As a feature of this circuit, a voltage dividing circuit 66 is provided for producing a voltage divided feedback voltage $v_4$ which is related to the capacitor voltage $V_C$ at the output of amplifier 55 and to the voltage $v_2$ at the output of amplifier 53, and which is fed back to the inverting input of amplifier 53. In particular, the output voltage $v_2$ from amplifier 53 is supplied through a diode 56, which compensates for the steady-state voltage drop across diode 54, and the output voltage $v_3$ from diode 56 is supplied to the non-inverting input of an operational amplifier 58, which functions as a voltage follower circuit. A reference current source 57 which produces a reference current $I_0$ is also connecterd to the non-inverting input of amplifier 58, and the output of amplifier 58 is connected to the inverting input thereof. It should be appreciated that voltage follower operational amplifiers 55 and 58 are provided to avoid any deleterious affect from directly using the capacitor voltage $V_C$ from capacitor 17 and the voltage $v_3$ from diode 56.

Voltage dividing circuit 66 is comprised of two series connected resistors 59 and 60 connected between the output of amplifier 58 and the output of amplifier 55, respectively, with the resistance of resistor 59 being selected as (N−1) times the resistance of resistor 60. Accordingly, the input voltages $v_3$ and $V_C$ supplied to voltage dividing circuit 66 are voltage divided with a ratio of between 1/N for $V_C=0$ and (N−1)/N for $v_3=0$.

With level detecting circuit 50, the logarithmically converted voltage $v_1$ at the output of operational amplifier 51 can be obtained in the same manner as the voltage v obtained in regard to the circuit of FIG. 2, as expressed by equation (2), and can be expressed as follows:

$$v_1 = V_T \ln\left(\frac{|i_{in}|}{I_S} + 1\right). \tag{14}$$

Further, the voltage divided feedback voltage $v_4$ from voltage dividing circuit 66 is related to the two input voltages $v_3$ and $V_C$ supplied thereto as follows:

$$\frac{v_3 - v_4}{(N-1)R} = \frac{v_4 - V_C}{R}. \tag{15}$$

It is to be appreciated, however, that, as previously discussed, operational amplifier 53 functions as a differential error circuit and accordingly, because of the feedback path from voltage dividing circuit 66 to the inverting input thereof, the voltage divided feedback voltage $v_4$ from voltage dividing circuit 66 is equal to the voltage $v_1$ supplied to the non-inverting input of amplifier 53. Accordingly, by substituting voltage $v_1$ for voltage $v_4$ in equation (15) and rearranging the terms in this latter equation, the following equation for voltage $v_3$ is obtained:

$$v_3 = N \cdot v_1 - V_C(N-1) \tag{16}$$

If voltage $v_1$ from equation (14) is substituted into equation (16), the following equation is obtained:

$$v_3 = N \cdot V_T \ln\left(\frac{|i_{in}|}{I_S} + 1\right) - V_C(N-1). \tag{17}$$

It is to be appreciated that the output voltage $v_2$ from operational amplifier 53 is equal to the voltage $v_3$ plus the voltage drop across diode 56. In other words, voltage $v_2$ is represented by the following equation:

$$v_2 = N \cdot V_T \cdot \ln\left(\frac{|i_{in}|}{I_S} + 1\right) + V_T \cdot \ln\left(\frac{I_0}{I_S} + 1\right) - V_C(N-1). \tag{18}$$

In much the same manner as equation (3) was derived, the current $i_d$ through diode 54 is expressed as follows:

$$i_d = I_S\left[\exp\left(\frac{v_2 - V_C}{V_T}\right) - 1\right]. \tag{19}$$

If the voltage $v_2$ from equation (18) is substituted into equation (19), the latter equation can rewritten as follows:

$$i_d = I_S\left[\left(\frac{|i_{in}|}{I_S} + 1\right)^N \left(\frac{I_0}{I_S} + 1\right) \cdot \exp\left(-\frac{N \cdot V_C}{V_T}\right) - 1\right]. \tag{20}$$

As previously discussed in regard to equations (5) and (7), the steady-state diode current $\bar{i_d}$ is expressed as follows:

$$\bar{i_d} = \frac{1}{T} \int_0^T i_d \, dt = I_0. \tag{21}$$

If the diode current $i_d$ from equation (20) is substituted into equation, (21) the following new equation is obtained:

$$\bar{i_d} = I_S\left[\frac{1}{T}\left(\frac{I_0}{I_S} + 1\right) \cdot \exp\left(-\frac{N \cdot V_C}{V_T}\right) \cdot \int_0^T \left(\frac{|i_{in}|}{I_S} + 1\right)^N dt - 1\right]. \tag{22}$$

If the reference current $I_0$ is substituted for the steady-state diode current $\bar{i_d}$ in equation (22) and the latter equation is rearranged to solve for the capacitor voltage $V_C$, the following equation is obtained:

$$V_C = \frac{V_T}{N} \cdot \ln\left[\frac{1}{T} \int_0^T \left(\frac{|i_{in}|}{I_S} + 1\right)^N dt\right] \quad (23)$$

Since the output voltage $V_0$ at output terminal 2 is equal to the capacitor voltage $V_C$ less the voltage drop across diode 61, the output voltage $V_0$ can be expressed as follows:

$$V_O = V_C - V_T \ln\left(\frac{I_O}{I_S} + 1\right). \quad (24)$$

If the capacitor voltage $V_C$ from equation (23) is substituted into equation (24), the following new equation is obtained:

$$V_O = \frac{V_T}{N} \cdot \ln\left[\frac{1}{T} \int_0^T \left(\frac{|i_{in}|}{I_S} + 1\right)^N dt\right] - V_T \cdot \ln\left(\frac{I_O}{I_S} + 1\right). \quad (25)$$

As previously discussed in regard to the circuit of FIG. 2, during steady-state conditions, the absolute value of the input current $i_{in}$ and the current $I_O > I_S$ so that equation (25) can be approximated as follows:

$$V_O \simeq \frac{V_T}{N} \ln\left[\frac{1}{T} \int_0^T \left(\frac{|i_{in}|}{I_S}\right)^N dt\right] - V_T \cdot \ln\left(\frac{I_O}{I_S}\right) \quad (26)$$

This equation can be simplified as follows:

$$V_O \simeq V_T \ln\left[\frac{1}{T} \int_0^T \left(\frac{|i_{in}|}{I_O}\right)^N dt\right]^{1/N}. \quad (27)$$

In order to further simplify equation (27), we utilize the following definition:

$$\frac{1}{T} \int_0^T \left(\frac{|i_{in}|}{I_O}\right)^N dt \equiv \left(\frac{\overline{i_{in}}}{I_O}\right)^N, \quad (28)$$

so that equation (27) reduces to:

$$V_O \simeq V_T \ln\left[\left(\frac{\overline{|i_{in}|}}{I_O}\right)^N\right]^{1/N}. \quad (29)$$

It is to be appreciated that the aforementioned conversion of the input signal by level detecting circuit 50 of the logarithmic compression type is independent of changes in the value of N. In this manner, a faster rise time constant or attack time can be achieved by means of the dividing ratio of resistors 59 and 60 without deterioration of other characteristics of the circuit, for use in high performance noise reduction circuits.

Figure 7:
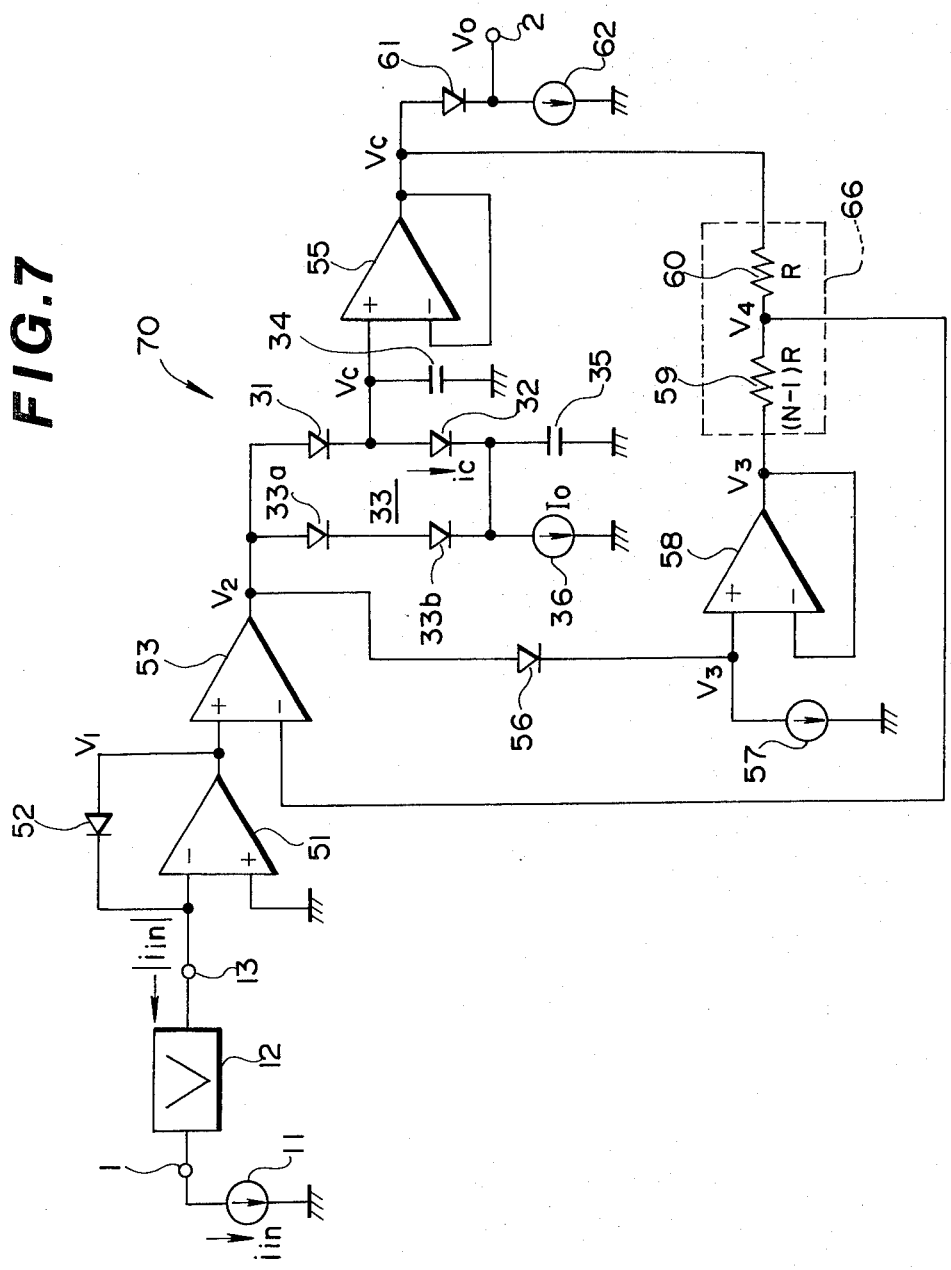
FIG. 7 is a circuit wiring diagram of a level detecting circuit according to another embodiment of this invention.

Referring now to FIG. 7, a level detecting circuit 70 of the logarithmic compression type according to another embodiment of this invention will be described, with elements corresponding to those described above with reference to level detecting circuit 50 of FIG. 6 being identified by the same reference numerals, and with a description of such corresponding elements being omitted for the sake of brevity. In particular, level detecting circuit 70 constitutes an improvement over level detecting circuit 50 and, in place of diode 54 and capacitor 17, includes a circular similar to that previously described in regard to FIG. 4. Thus, a first signal path comprised of series-connected diodes 31 and 32 which constitute first and second PN junction elements, is connected between the output of amplifier 53 and a current source 36. A second signal path comprised of a third PN junction element 33 which is constituted by series-connected first and second diodes 33a and 33b, is connected in parallel with the series connection of first and second diodes 31 and 32. A first electrostatic capacitance element formed of a capacitor 34 is connected between the connection point of first and second diodes 31 and 32 and ground, and a second electrostatic capacitance element formed of a capacitor 35 is connected between the connection point of diodes 32 and 33b and ground. It is to be appreciated that the above-described elements are designated by the same reference numerals as the corresponding elements in FIG. 4 to clarify the operation of the above-described circuit constituted by diodes 31, 32, 33a and 33b, and capacitors 34 and 35. Since the circuit is thus substantially identical to the circuit previously described in regard to FIG. 4, the operation thereof will not be repeated herein. The remainder of the level detecting circuit 70 of FIG. 7 has the same construction as level detecting circuit 50 of FIG. 6 and will not be repeated herein.

Figure 8:
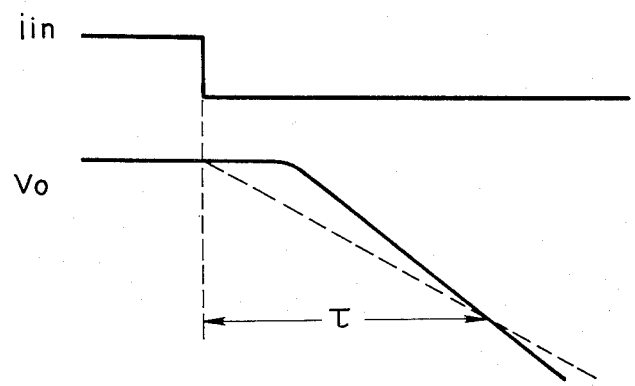
FIGS. 8–10 are waveform diagrams used for explaining the advantages of the level detecting circuit according to this invention over the prior art level detecting circuits of FIGS. 1–3 and the previously proposed level detecting circuit of FIG. 6.
Figure 9:
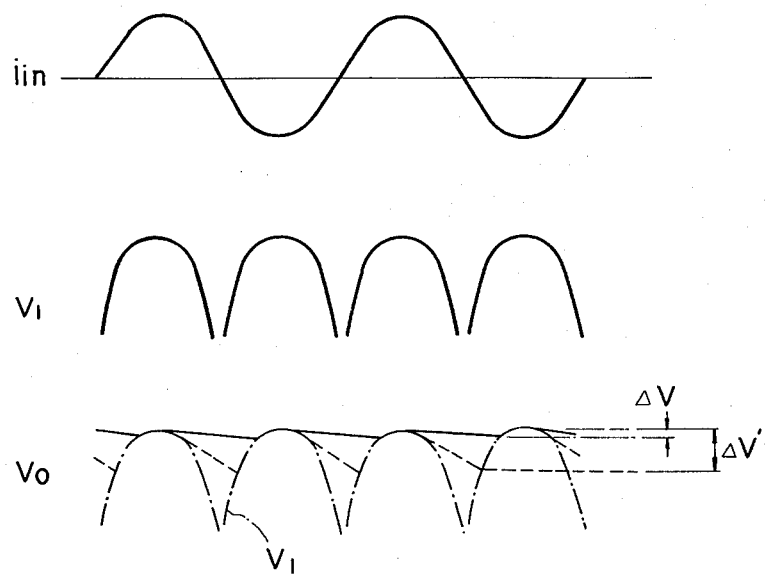
Figure 10:
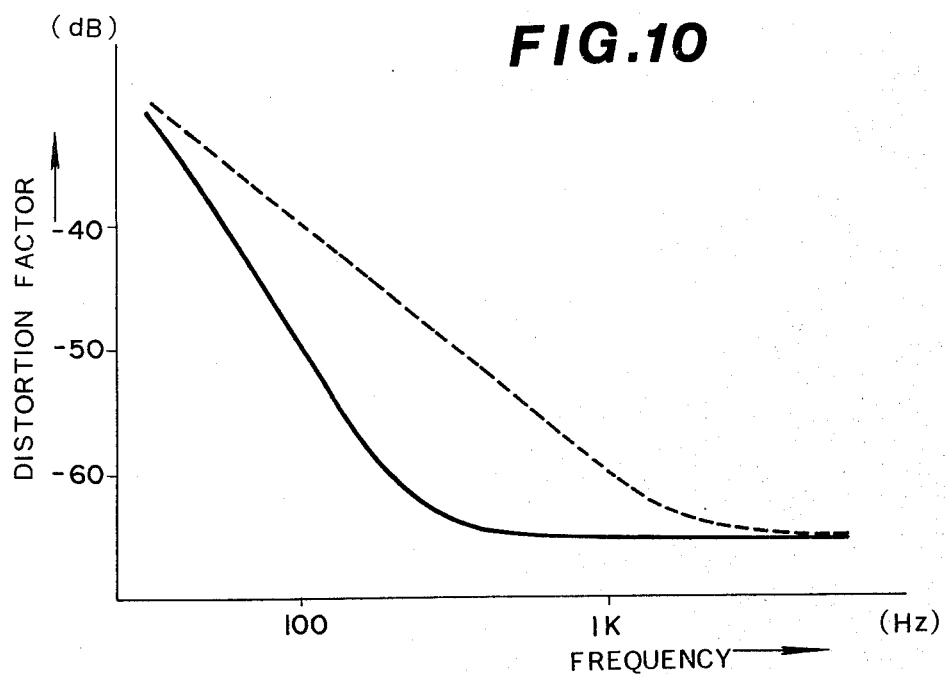

The advantages of the present invention will be readily apparent from a review of the graphical diagrams of FIGS. 8–10. In FIG. 8, when an input signal $i_{in}$ is blocked or abruptly attenuated, the output signal $V_0$ will also fall at such time with a previously known level detecting circuit of the logarithmic compression type, as shown by the dashed line in FIG. 8. However, in accordance with the present invention, a predetermined hold period is provided from the time at which the input signal $i_{in}$ falls, in which predetermined time the level of the output voltage $V_0$ is maintained at its high level and, only after such predetermined time, does the output voltage $V_0$ begin to fall. As previously discussed, ripple components which result in low frequency band harmonic distortion are present during the hold period. Thus, as shown in FIG. 9, although the fall time constant for known level detecting circuits of the logarithmic compression type is the same as the fall time constant for level detecting circuit 70 according to this invention, the ripple component $\Delta v$ that results from low frequency signals with the present invention, as shown by the solid line for $V_0$ in FIG. 9, is much smaller than the ripple component $\Delta v'$ that results from previously known level detecting circuits of the logarithmic compression type, as shown by the dashed line in FIG. 9. This large ripple component $\Delta v'$, as previously discussed, results in large low frequency band harmonic distortion during the aforementioned hold period. In particular, as shown in FIG. 10, with previously known level detecting circuits of the logarithmic compression type, the harmonic distortion factor with respect to low frequency signals is much greater than that for level detecting circuit 70 according to this invention.

Figure 11:
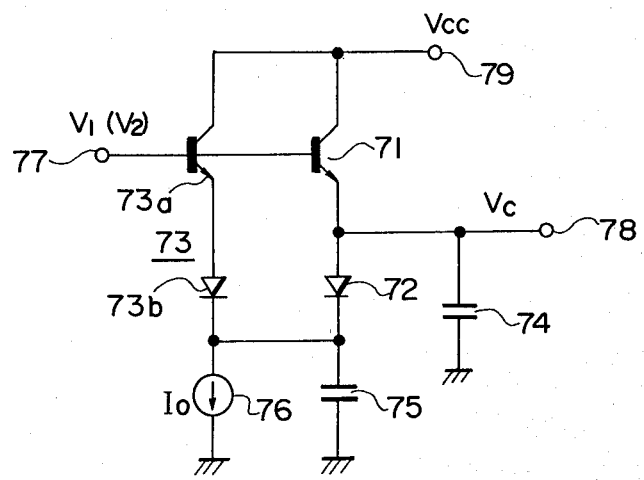
FIG. 11 is a circuit wiring diagram of a portion of a level detecting circuit according to still another embodiment of this invention.

Referring now to FIG. 11, an essential portion of a level detecting circuit according to another embodiment of this invention includes an input terminal 77 which is either supplied with voltage $v_1$ from the output of operational amplifier 14 in level detecting circuit 30 of FIG. 4 or with voltage $v_2$ from the output of operational amplifier 53 in level detecting circuit 70 of FIG. 7. The voltage $v_1$ or $v_2$ obtained through the conversion of the absolute value of the alternating current input signal $i_{in}$ is supplied through input terminal 77 to the base of an NPN transistor 73a and to the base of an NPN transistor 71. Transistor 71 has its collector-emitter path connected in series with a diode 72 between a reference voltage supply terminal 79 which supplies a reference voltage $V_{CC}$ and a current source 76. It is to be appreciated, therefore, that the base-emitter path of transistor 71 constitutes the aforementioned first junction element and diode 72 constitutes the second PN junction element. In like manner, the series-connection of the collector-emitter path of transistor 73a and a diode 73b is connected in parallel with the series-connection of transistor 71 and diode 72. It is to be appreciated that the base-emitter path of transistor 73a and diode 73b constitutes a third PN junction element 73. Further, in a similar manner to the construction of FIGS. 4 and 7 previously described, an integrating capacitor 74 is connected between ground and the connection point between transistor 71 and diode 72 and constitutes the aforementioned first electrostatic capacitance element, and an integrating capacitor 75 is connected between ground and the connection point between diodes 72 and 73b and constitutes the aforementioned second electrostatic capacitance element. The terminal voltage $V_C$ which is supplied to either the base of transistor 37 in the circuit of FIG. 4 or to the noninverting input of amplifier 55 in the circuit of FIG. 7 is produced across capacitor 74 and supplied to an output terminal 78. It is to be appreciated that the basic operation of the circuit shown in FIG. 11 is substantially identical to the corresponding circuits of FIG. 4 and 7. However, an advantage that results from the circuit of FIG. 11 is that operational amplifier 14 of FIG. 4 or operational amplifier 53 of FIG. 7 may have a small current supply capacity.

As previously discussed, a level detecting circuit for a noise reduction circuit generates a ripple component consisting of the fundamental wave and/or harmonic waves of the input signal during the level detecting operation. The level of the ripple component is generally inversely proportional to the fall time constant and input frequency of the input current signal. However, if the fall time constant is optimized to prevent deterioration of the tonal quality due to noise modulation, the level of a generated ripple component increases to further deteriorate the low frequency band harmonic distortion. According to the present invention, in a level detecting circuit of the logarithmic compression type, a hold effect is produced which permits the fall time constant to be set to an optimum value to prevent deterioration due to noise modulation and, at the same time, prevents an increase in the level of the ripple component. Further, the level detecting circuit of the logarithmic compression type according to this invention produces a broad dynamic range without further deteriorating the low frequency band harmonic distortion and thereby can be used in a high performance noise reduction system.

Having described specific preferred embodiments with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A level detecting circuit for producing a level detected output signal in response to an input signal, comprising:
    means for logarithmically converting said input signal to produce a logarithmically converted signal;
    first means forming a first signal path supplied with said logarithmically converted signal and having a first saturation current;
    second means forming a second signal path supplied with said logarithmically converted signal and having a second saturation current greater than said first saturation current;
    reference current means for supplying a reference current to said first and second signal paths;
    first capacitance means having a first capacitance and connected to said first signal path for producing an integrated signal;
    second capacitance means having a second capacitance less than said first capacitance and connected to said first and second signal paths; and
    output means for producing said level detected output signal in response to said integrated signal.

2. A level detecting circuit according to claim 1; in which said first signal path includes first PN junction means and second PN junction means connected in series, and said second signal path includes third PN junction means connected in parallel with the series connection of said first and second PN junction means.

3. A level detecting circuit according to claim 2; in which said first PN junction means includes one of a first transistor and a first diode, said second PN junction means includes one of a second transistor and a second diode, and said third PN junction means includes one of a third transistor and a third diode and one of a fourth transistor and a fourth diode connected in series.

4. A level detecting circuit according to claim 2; in which said first and second PN junction means are connected to each other at a connection point, and said first capacitance means is connected between said connection point and a reference potential.

5. A level detecting circuit according to claim 2; in which said second and third PN junction means are connected to each other at a connection point, and said second capacitance means is connected between said connection point and a reference potential.

6. A level detecting circuit according to claim 2; in which said second and third PN junction means are connected to each other at a connection point, and said reference current means supplies said reference current to said first and second signal paths through said connection point.

7. A level detecting circuit according to claim 1; in which said means for logarithmically converting includes an operational amplifier having an inverting input and an output, and semiconductor means connected between said inverting input and said output of said operational amplifier.

8. A level detecting circuit according to claim 7; in which said semiconductor means includes at least one diode.

9. A level detecting circuit according to claim 1; further comprising amplifying means supplied with said logarithmically converted signal and at least one feedback signal for producing a logarithmically amplified signal in response thereto which is supplied to said first and second signal paths; and feedback means for producing said at least one feedback signal in response to said logarithmically amplified signal and said integrated signal.

10. A level detecting circuit according to claim 9; in which said amplifying means includes an operational amplifier having a non-inverting input supplied with said logarithmically converted signal and an inverting input supplied with said at least one feedback signal.

11. A level detecting circuit according to claim 9; in which said feedback means includes voltage dividing means for producing said at least one feedback signal in response to said logarithmically amplified signal and said integrated signal, first supply means for supplying said logarithmically amplified signal to said voltage dividing means, and second supply means for supplying said integrated signal to said voltage dividing means.

12. A level detecting circuit according to claim 11; in which said voltage dividing means includes a first resistive element and a second resistive element connected in series between said first and second supply means, and a feedback signal being produced at the connection point between said first and second resistive elements.

13. A level detecting circuit according to claim 12; in which said first supply means includes PN junction means and first voltage follower means connected between said amplifying means and said first resistive element, and said second supply means includes second voltage follower means connected between said first capacitance means and said second resistive element.

14. A level detecting circuit according to claim 13; in which said first voltage follower means includes an operational amplifier having an input supplied with said logarithmically amplified signal through said PN junction means and having an output for supplying said logarithmically amplified signal to said first resistive element, and said second voltage follower means includes an operational amplifier having an input supplied with said integrated signal and having an output for supplying said integrated signal to said second resistive element.

15. A level detecting circuit according to claim 12; in which said second resistive element has a first resistance and said first resistive element has a second resistance which is (N−1) times the first resistance.

16. A level detecting circuit according to claim 1; in which said output means includes PN junction means supplied with said integrated signal for producing said level detected output signal in response thereto.

17. A level detecting circuit for producing a level detected output signal in response to an input signal, comprising:
means for logarithmically converting said input signal to produce a logarithmically converted signal;
first PN junction means supplied with said logarithmically converted signal;
second PN junction means connected in series with said first PN junction means at a connection point;
first integrating means connected to said connection point for producing an integrated signal;
third PN junction means connected in parallel with the series connection of said first and second PN junction means;
second integrating means connected to said second and third PN junction means;
reference current means for providing a reference current to said second PN junction means; and
output means for producing said level detected output signal in response to said first integrated signal.

* * * * *